United States Patent [19]

Hsu

[11] Patent Number: 6,025,588

[45] Date of Patent: Feb. 15, 2000

[54] OPTICAL ANALOG POTENTIOMETER

[75] Inventor: Fan-Yi Hsu, Taipei, Taiwan

[73] Assignee: Anko Electronics Co., Ltd., Taipei, Taiwan

[21] Appl. No.: 09/157,269

[22] Filed: Sep. 21, 1998

[51] Int. Cl.[7] ................................ G01D 5/34; G01J 1/32
[52] U.S. Cl. .......................... 250/214 PR; 250/231.13; 250/239
[58] Field of Search ................... 250/214.12, 231.13, 250/231.14, 231, 239, 229

[56] References Cited

U.S. PATENT DOCUMENTS

| | | | |
|---|---|---|---|
| 4,284,885 | 8/1981 | Swensen | 250/229 |
| 4,387,374 | 6/1983 | Wiener | 250/231.13 |
| 4,475,034 | 10/1984 | Maddox et al. | 250/231.13 |
| 5,057,684 | 10/1991 | Service | 250/231.13 |
| 5,446,067 | 8/1995 | Schmidt et al. | 338/172 |
| 5,569,906 | 10/1996 | Wong | 250/231.13 |
| 5,708,496 | 1/1998 | Barnett et al. | 250/231.13 |
| 5,923,032 | 7/1999 | Carlson et al. | 250/231.13 |

Primary Examiner—Robert H. Kim
Assistant Examiner—Zandra Smith
Attorney, Agent, or Firm—A & J

[57] ABSTRACT

A potentiometer includes a shaft, a base including a printed circuit board on which are fixedly mounted a light emitter and a light receiver arranged opposite to and spaced from the light emitter, the light emitter being supplied with steady voltage to emit light and provide working voltage to the light receiver, a circular seat formed with an opening and fixedly mounted on an upper end of the shaft, a plastic film arranged on an outer edge of the opening and disposed between the light emitter and the light receiver, the plastic film being provided two end portions which are opaque and an intermediate portion which decreases in transparency from one side to another side thereof, and a cover fixedly mounted on the base to enclose the circular seat, whereby the potentiometer is of high sensitivity, durable in use, low in cost, easily converted from a conventional rheostat and fit for mass production.

3 Claims, 3 Drawing Sheets

OPTICAL ANALOG POTENTIOMETER

BACKGROUND OF THE INVENTION

1. Field of the Invention

This invention is related to an improved potentiometer.

2. Description of the Prior Art

The conventional rheostat is an electric component in which resistance introduced into a circuit is readily variable by a knob or handle. However, the carbon contact point of the rheostat will be worn away after the rheostat has been used for a certain periord of time, thereby making it unable to work normally and unfit to be used with joysticks.

Therefore, it is an object of the present invention to provide an improved potentiometer which can obviate and mitigate the above-mentioned drawbacks.

SUMMARY OF THE INVENTION

This invention is related to an improved potentiometer.

According to a preferred embodiment of the present invention, a potentiometer includes a shaft, a base including a printed circuit board on which are fixedly mounted a light emitter and a light receiver arranged opposite to and spaced from the light emitter, the light emitter being supplied with steady voltage to emit light and provide working voltage to the light receiver, a circular seat formed with an opening and fixedly mounted on an upper end of the shaft, a plastic film arranged on an outer edge of the opening and disposed between the light emitter and the light receiver, the plastic film being provided two end portions which are opaque and an intermediate portion which decreases in transparency from one side to another side thereof, and a cover fixedly mounted on the base to enclose the circular seat.

It is the primary object of the present invention to provide an optical analog potentiometer which is of high sensitivity.

It is another object of the present invention to provide an optical analog potentiometer which is durable in use.

It is still another object of the present invention to provide an optical analog potentiometer which can be easily converted from a conventional carbon brush type rheostat.

It is still another object of the present invention to provide an optical analog potentiometer which is low in cost.

It is a further object of the present invention to provide an optical analog potentiomenter which is fit for mass production.

The foregoing objects and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

Figure 1:
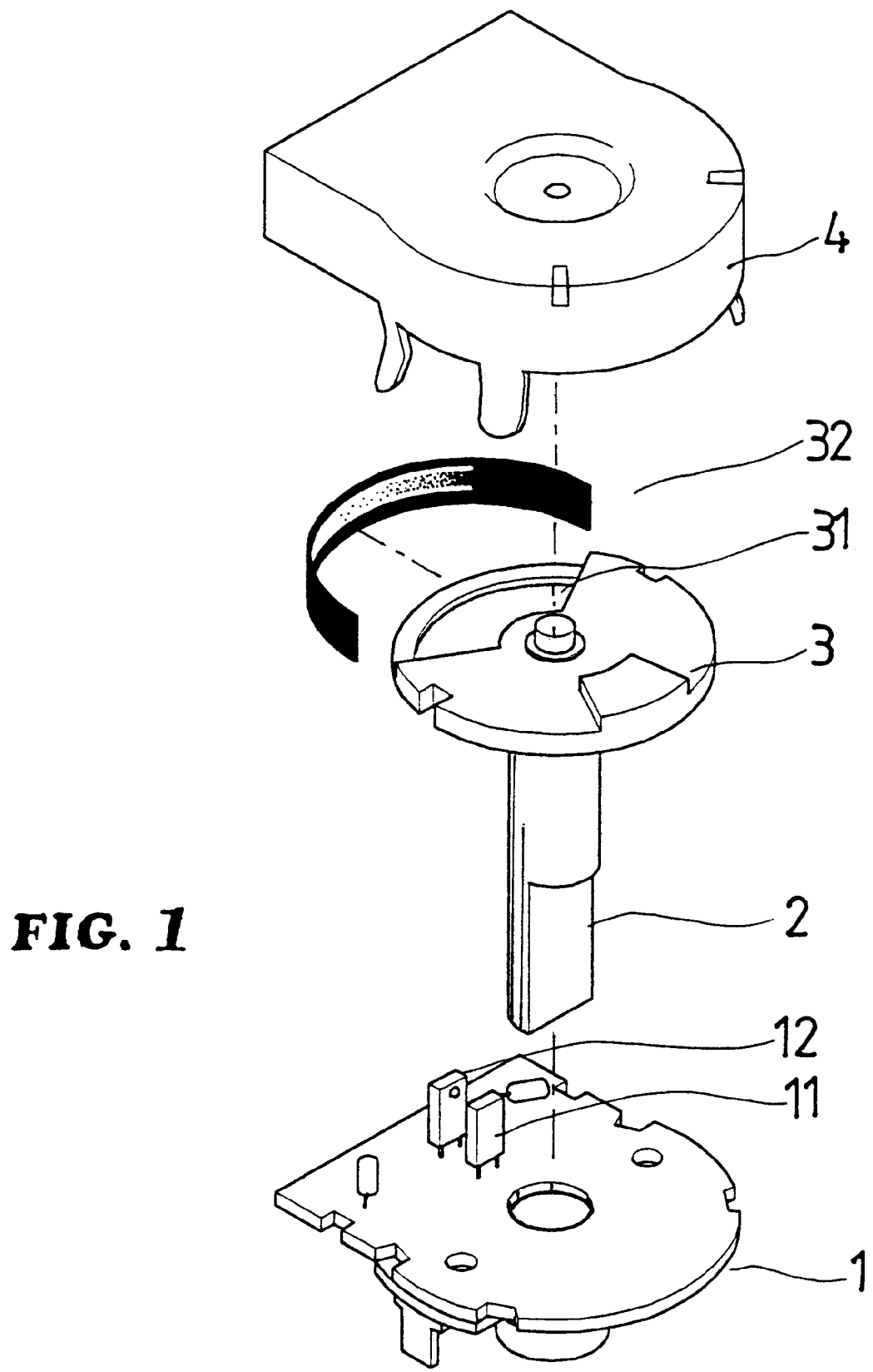
FIG. 1 is an exploded view of the present invention.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

Figure 2:
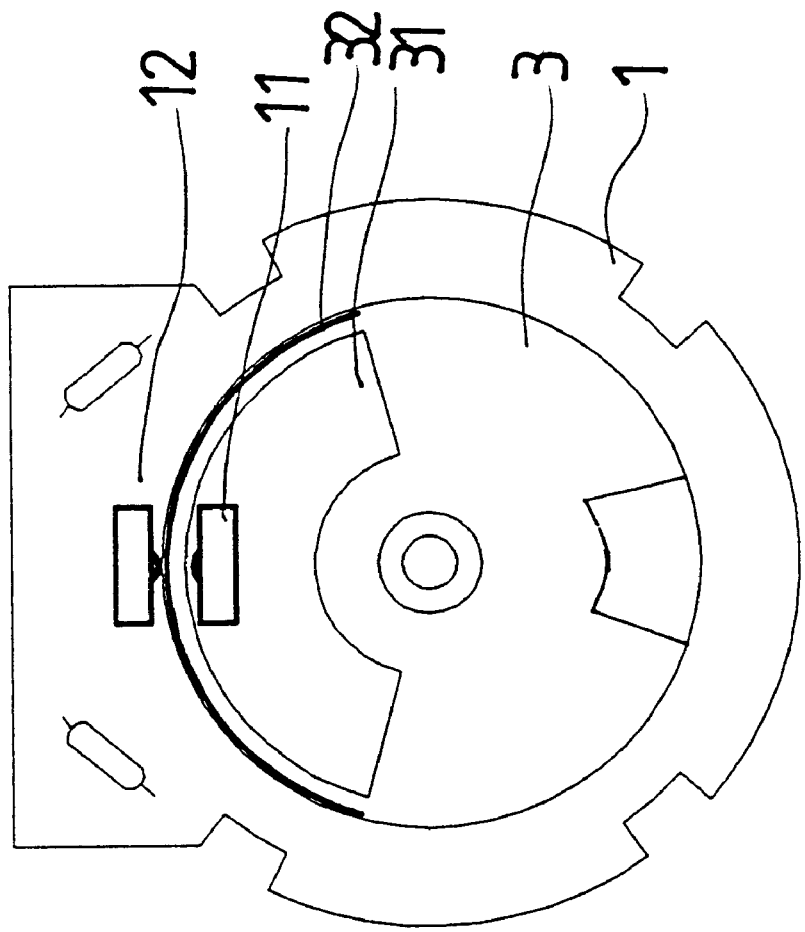
FIG. 2 is a top view illustrating the interior structure of the present invention.

With reference to the drawings and in particular to FIGS. 1 and 2 thereof, the optical analog potentiometer according to the present invention generally comprises a base 1, a shaft 2, a seat 3 and a cover 4.

The base 1 includes a printed circuit board on which are mounted a light emitter 11 and a light receiver 12 located opposite to the light emitter 11. The light emitter 11 is supplied with steady voltage via electrical circuit to emit light and provide working voltage to the light receiver 12. The light emitter 11 and the light receiver 12 may be of any conventional design well to the art and are not considered a part of the invention. The light receiver 12 is mounted opposite to the light emitter 11 and there is a clearance between them thereby forming a photoelectric device.

The seat 3 is a circular member formed with a sectorial opening 31 and fixedly mounted on an upper end of the shaft 2. A plastic film 32 is arranged on the outer edge of the sectorial opening 31. The plastic film 32 is provided two end portions 322 which are opaque and an intermediate portion 321 which are transparent. The degree of transparency of the intermediate portion 321 decreases from one side to another (see FIG. 3B). The lower end of the shaft 2 is fitted through the center hole of the base 1 so that the plastic film 32 is disposed between the light emitter 11 and the light receiver 12.

The seat 3 is enclosed by the cover 4 which is fixedly mounted on the base 1 thereby preventing the photoelectric device from being interfered by disturbing signals and unnecessary light and protecting it from being damaged.

Figure 3:
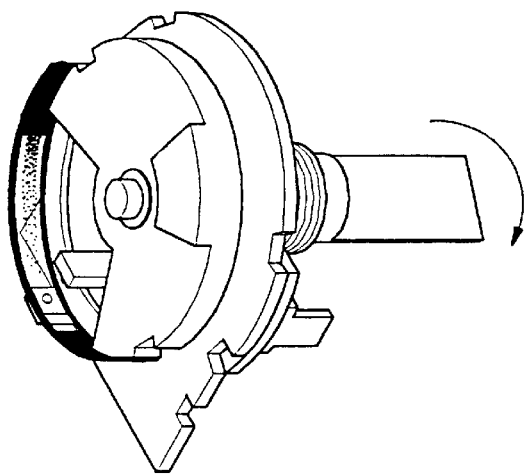
FIGS. 3A, 3B and 3C are working views of the present invention.
Figure 3:
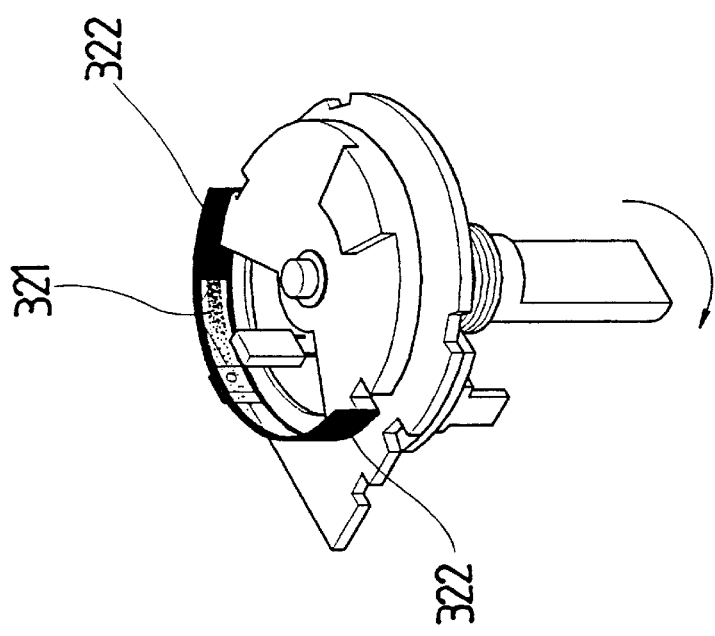
Figure 3:
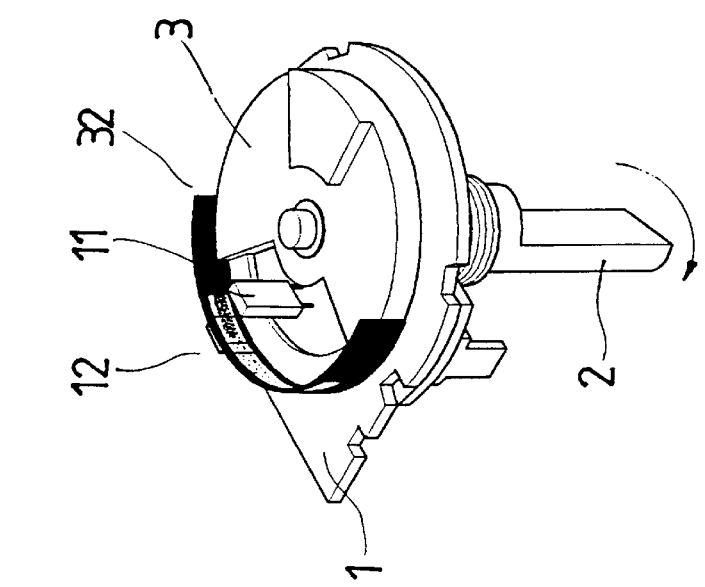

Referring to FIGS. 3A, 3B and 3C, when the shaft 2 is turned, the seat 3 will be turned therewith so that the position of the plastic film 32 will be changed relative to the photoelectric device thereby controlling the intensity of light received by the light receiver 12 and therefore controlling the current provided the by light receiver 12. The light emitter 11 and the light receiver 12 are fixedly mounted on the base 1 and are not influenced by the rotation of the shaft 2. The potentiometer according to the present invention is very sensitive and durable in use and can be converted from a conventional rheostat.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

I claim:

1. A potentiometer comprising:

a shaft;

a base including a printed circuit board on which are fixedly mounted a light emitter and a light receiver arranged opposite to and spaced from said light emitter, said light emitter being supplied with steady voltage to emit light and provide working voltage to said light receiver;

a circular seat formed with an opening and fixedly mounted on an upper end of said shaft;

a plastic film arranged on an outer edge of said opening and disposed between said light emitter and said light receiver; and a cover fixedly mounted on said base to enclose said circular seat.

2. The potentiometer as claimed in claim 1, wherein said plastic film is provided two end portions which are opaque and an intermediate portion which decreases in transparency from one side to another side thereof.

3. The potentiometer as claimed in claim 1, wherein said opening is sectorial in shape.

* * * * *